(12) United States Patent
Ebisumoto et al.

(10) Patent No.: US 9,247,171 B2
(45) Date of Patent: Jan. 26, 2016

(54) SENSITIVITY ADJUSTMENT DEVICE

(71) Applicant: YOKOGAWA ELECTRIC CORPORATION, Tokyo (JP)

(72) Inventors: Shunsuke Ebisumoto, Tokyo (JP); Kazuhiro Hashizumi, Tokyo (JP); Yoshiharu Shiratori, Tokyo (JP)

(73) Assignee: Yokogawa Electric Corporation, Tokyo (JP)

( * ) Notice: Subject to any disclaimer, the term of this patent is extended or adjusted under 35 U.S.C. 154(b) by 49 days.

(21) Appl. No.: 14/028,096

(22) Filed: Sep. 16, 2013

(65) Prior Publication Data

US 2014/0077084 A1 Mar. 20, 2014

(30) Foreign Application Priority Data

Sep. 19, 2012 (JP) ................................. 2012-205923

(51) Int. Cl.
*H04N 5/378* (2011.01)
*G01J 1/18* (2006.01)
*H03K 17/96* (2006.01)

(52) U.S. Cl.
CPC . *H04N 5/378* (2013.01); *G01J 1/18* (2013.01); *H03K 17/9636* (2013.01); *H03K 2217/94026* (2013.01); *H03K 2217/94031* (2013.01); *H03K 2217/94108* (2013.01)

(58) Field of Classification Search
CPC ........ H03K 17/9636; H04N 5/378; G01J 1/18
See application file for complete search history.

(56) References Cited

U.S. PATENT DOCUMENTS

| 6,211,784 | B1 * | 4/2001 | Nishide ...................... 340/568.1 |
| 2007/0182717 | A1 | 8/2007 | Arnold |
| 2008/0100593 | A1 * | 5/2008 | Skillman et al. .............. 345/175 |
| 2010/0253639 | A1 * | 10/2010 | Huang et al. .................. 345/173 |
| 2012/0109455 | A1 * | 5/2012 | Newman et al. ................ 701/36 |

FOREIGN PATENT DOCUMENTS

| EP | 0 797 107 A2 | 9/1997 |
| JP | 9-270689 A | 10/1997 |
| JP | 9-284115 A | 10/1997 |
| JP | 2002-43612 A | 2/2002 |
| JP | 2005-105681 A | 4/2005 |
| JP | 2009-124666 A | 6/2009 |

* cited by examiner

*Primary Examiner* — David Porta
*Assistant Examiner* — Mindy Vu
(74) *Attorney, Agent, or Firm* — Sughrue Mion, PLLC

(57) ABSTRACT

A sensitivity adjustment device may include: a light receiver configured to receive a reflected light that has been emitted from a light emitting unit and reflected by a reflector, the light receiver being configured to convert the reflected light into an analog electrical signal; an A/D converter configured to convert the analog electrical signal into a digital signal; a threshold value calculator configured to calculate a threshold value with reference to a voltage level of the digital signal that has been sequentially converted and output by the A/D converter; and a determination unit configured to compare a high voltage level of the digital signal with the threshold value.

17 Claims, 12 Drawing Sheets

<DURING OFF STATE OF SWITCH>
LESS THAN A/D THRESHOLD VALUE
→DETERMINE TO BE OFF

<DURING OFF STATE OF SWITCH>
EQUAL TO OR MORE THAN A/D THRESHOLD VALUE
→DETERMINE TO BE ON

<DURING ON STATE OF SWITCH>
EQUAL TO OR MORE THAN A/D THRESHOLD VALUE
→DETERMINE TO BE ON

<DURING ON STATE OF SWITCH>
LESS THAN A/D THRESHOLD VALUE
→DETERMINE TO BE OFF

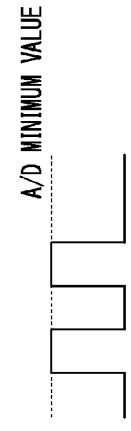
FIG. 4A
⟨INITIAL STATE⟩
FIG. 4B
⟨THERE IS NO STATE TRANSITION⟩
⇨
FIG. 4C
⟨UPDATE A/D MINIMUM VALUE⟩
FIG. 4D
⟨DETECT SWITCH ON⟩
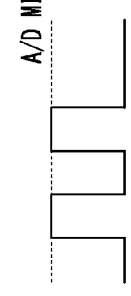
FIG. 4E
⟨SWITCH A/D THRESHOLD VALUE⟩
⇨
FIG. 4F
⟨UPDATE A/D MAXIMUM VALUE⟩
FIG. 4G
⟨THERE IS NO STATE TRANSITION⟩
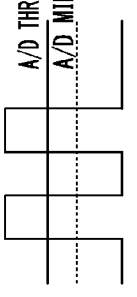
FIG. 4H
⟨DETECT SWITCH OFF⟩
⇨
FIG. 4I
⟨SWITCH A/D THRESHOLD VALUE⟩
(RESET)
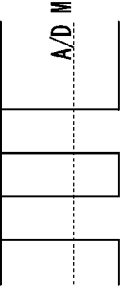
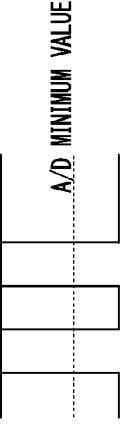

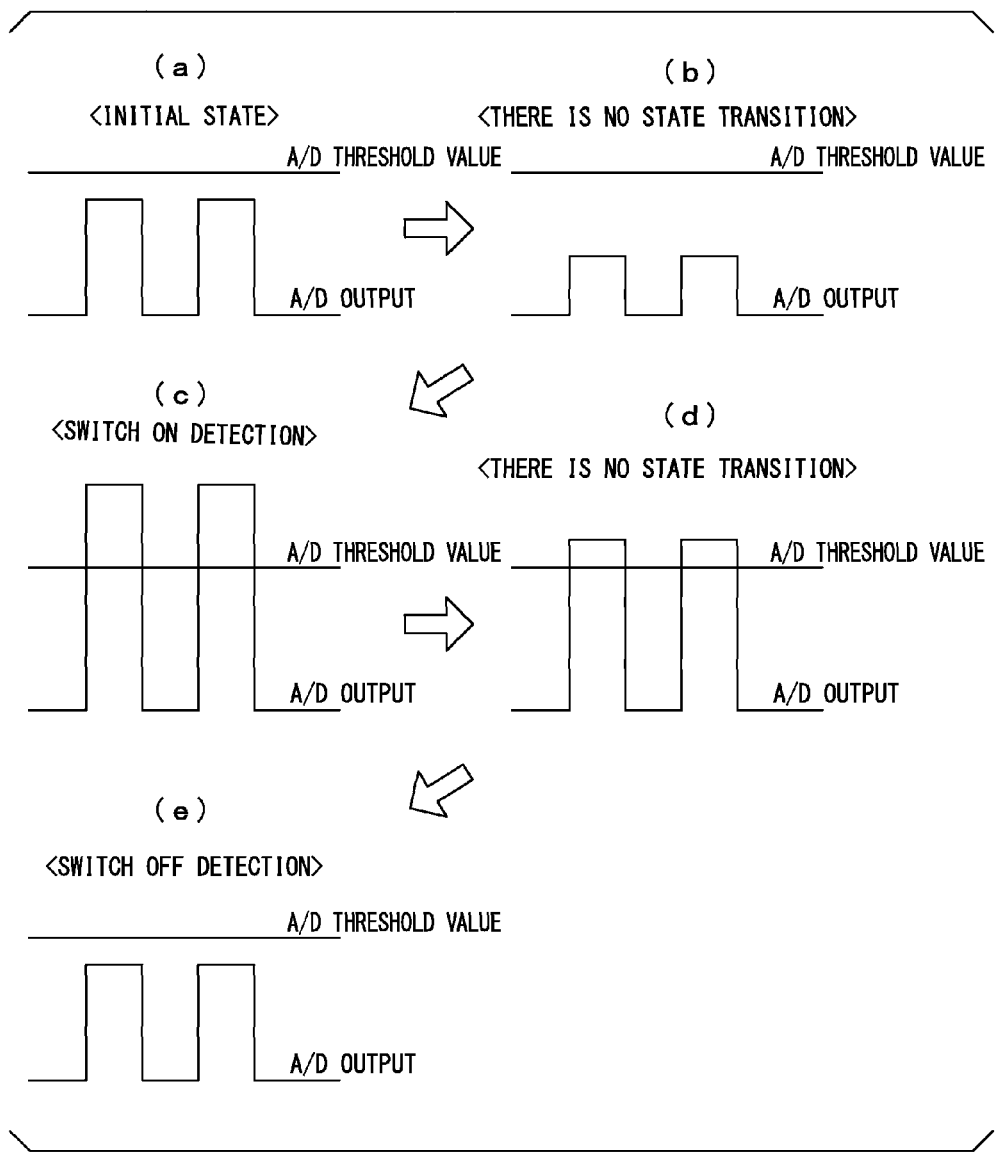

<REFLECTOR IS NOT PRESENT>

<REFLECTOR HAVING LOW REFLECTANCE IS PRESENT>

<REFLECTOR HAVING MEDIUM REFLECTANCE IS PRESENT>

<REFLECTOR HAVING HIGH REFLECTANCE IS PRESENT>

SENSITIVITY ADJUSTMENT DEVICE

BACKGROUND OF THE INVENTION

1. Field of the Invention

The present invention relates to a sensitivity adjustment device. More specifically, the present invention relates to an automatic sensitivity adjustment based on A/D conversion output data.

Priority is claimed on Japanese Patent Application No. 2012-205923, filed Sep. 19, 2012, the content of which is incorporated herein by reference.

2. Description of the Related Art

All patents, patent applications, patent publications, scientific articles, and the like, which will hereinafter be cited or identified in the present application, will hereby be incorporated by reference in their entirety in order to describe more fully the state of the art to which the present invention pertains.

For example, in a field device that is mounted on an installation site such as a piping passage of a plant in a process control system, as a switch mechanism that is manually operated by an operator setting parameters or the like at the site, there are mechanisms in which an infrared touch switch is incorporated.

FIG. 9 is an illustrative diagram of a constitution illustrating an example of an infrared touch switch of the related art in which a sensitivity adjustment function is incorporated. In FIG. 9, a light emitting unit 1 includes an infrared light emitting element. The infrared light emitting element is driven via a light emitting controller 4 based on a predetermined timing pulse signal which is generated and output by a timing controller 3 controlled by a CPU 2, and radiates outside of the facility.

For example, the light radiated from the light emitting unit 1 is reflected by a reflector 5 such as fingers of an operator, is incident on a light receiver 6, and is converted into analog electrical signals.

The analog electrical signals converted by the light receiver 6 are input to an A/D converter 7 which is controlled by the CPU 2, and are converted into digital signals.

The digital signals, which are converted and output by the A/D converter 7, are stored as touch detection data in a data storage region of a RAM 8 which is controlled by the CPU 2.

The CPU 2 performs overall control on the entire device based on a predetermined software program stored in a ROM 9, variable parameters appropriately set and stored in the RAM 8, or the like so that the device is operated as an infrared touch switch having a predetermined touch detection sensitivity.

A display unit 10 displays a predetermined display screen such as a process value display screen or a parameter setting screen which is created by a display controller 11 controlled by the CPU 2.

A nonvolatile memory 12 stores and holds sensitivity adjustment parameters for adjusting the touch detection sensitivity of the infrared touch switch via a nonvolatile memory controller 13 which is controlled by the CPU 2.

Based on the control of a communication controller 15 which is controlled by the CPU 2, a communication unit 14 executes transmission and reception of sensitivity adjustment parameters of the infrared touch switch between a communication tool (not shown) outside the facility and the communication unit 14.

Based on the control of the CPU 2, a switch operation determination unit 16 determines whether a touch detection operation is performed based on touch detection data converted and output by the A/D converter 7.

Operations of main units will be described in detail with reference to the drawings.

FIGS. 10(A) to 10(C) are illustrative diagrams of data sampling in the A/D converter 7 of the analog electric signals which are converted by the light receiver 6. In FIG. 10(A), a light emission pulse which is radiated from the light emitting unit 1, and is emitted and output based on a predetermined timing pulse signal which is generated and output by the timing controller 3 controlled by the CPU 2, is illustrated.

In FIG. 10(B), output data of the A/D converter 7 based on reflected light incident on the light receiver 6 is illustrated, and an A/D conversion operation of the A/D converter 7 is executed based on a predetermined sampling clock which is indicated by FIG. 10(C), and is generated and output by the timing controller 3.

Here, intensity of the reflected light is changed according to presence or absence of the reflector 5 or a difference of reflectance of the reflector 5, and a signal level of the output data of the A/D converter 7 is changed according to the change of the intensity of the reflected light. Moreover, the frequency of the light emission pulse or the timing of light-receiving A/D sampling may be arbitrarily determined. A signal level is used to mean a voltage level of a digital signal.

FIGS. 11A and 11B are illustrative diagrams of a threshold value which determines whether the touch detection operation is performed at the switch operation determination unit 16, and for example, is used for a comparison value of a signal level of output data of the A/D converter 7 at timings of t1 and t3 of the sampling clock of FIG. 10(C). FIG. 11A shows a state in which the signal level of the output data of the A/D converter 7 is less than the threshold value and a switch is determined to be "OFF." FIG. 11B shows a state in which the signal level of the output data of the A/D converter 7 is equal to or more than the threshold value and a switch is determined to be "ON."

The threshold value is set and input as a numerical value via the communication tool, and is stored and held in the nonvolatile memory 12 via the nonvolatile memory controller 13.

Circuit errors of the infrared touch switch or hardware characteristics including characteristics of the light emitting and light receiving elements, temperature characteristics, or the like are different individually, and thus the storage and holding of the threshold value are performed based on the fact that the individual threshold value is required for each switch.

Moreover, since the threshold value may be changed according to an adjustment examination in a manufacturing process via the communication tool or a setting of a user, it is necessary to store the threshold value in the nonvolatile memory 12.

FIGS. 12(a) to 12(e) are illustrative diagrams of a determination sequence in the switch operation determination unit 16. FIG. 12(a) shows an initial state, in which the switch is in an OFF state, and the A/D output is less than an A/D threshold value.

FIG. 12(b) shows a state in which the A/D output is changed from the state shown in FIG. 12(a) to a range in which the A/D output does not exceed the A/D threshold value. Since the A/D output is less than the A/D threshold value, the switch remains in an OFF state.

FIG. 12(c) shows a state in which the A/D output is increased from the state of FIG. 12(b) to a range in which the A/D output exceeds the A/D threshold value. Since the A/D output is equal to or more than the A/D threshold value, the switch is changed to remains in the ON state.

FIG. 12(e) shows a state in which the A/D output is decreased from the state of FIG. 12(d) to a range in which the A/D output is lower than the A/D threshold value. Since the A/D output is less than the A/D threshold value, the switch is changed to an OFF state.

FIGS. 13A to 13C are illustrative diagrams of sensitivity when there are differences in the hardware characteristics of the above-described infrared touch switch. FIG. 13A is an example of a high sensitivity switch, and shows a state in which the A/D output exceeds the A/D threshold value regardless of presence or absence of the reflector 5. In this case, the switch operation determination unit 16 responds regardless of the presence or absence of the reflector 5 and determines the switch is in the ON state, and the switch does not function as the infrared touch switch.

FIG. 13B shows an example of a medium sensitivity switch, and shows a state in which the A/D output is lower than the A/D threshold value when the reflector 5 is not present and the A/D output exceeds the A/D threshold value when the reflector 5 is present. In this case, the switch operation determination unit 16 does not respond when the reflector 5 is not present and determines the switch is in the OFF state, and responds when the reflector 5 is present and determines the switch is in the ON state, and thus the switch functions as the infrared touch switch.

FIG. 13C shows an example of a low sensitivity switch, and shows a state in which the A/D output is lower than the A/D threshold value regardless of the presence or absence of the reflector 5. In this case, the switch operation determination unit 16 does not respond regardless of the presence or absence of the reflector 5 and determines the switch is in the OFF state, and similar to that of FIG. 13A, the switch does not function as the infrared touch switch.

As is clear from FIGS. 13A to 13C, since the A/D output is largely changed according to the hardware characteristics of the infrared touch switch, it may be necessary to set the A/D threshold value to an optimal value such as an intermediate value between when the reflector is not present and when the reflector is present. Accordingly, the adjustment examination becomes essential in the manufacturing process.

FIGS. 14A to 14D are illustrative diagrams of sensitivity when there are differences in reflection characteristics of the reflector 5. FIG. 14A is an example when the reflector 5 is not present, the A/D output is lower than the A/D threshold value, and the switch operation determination unit 16 does not respond and determines the switch is in the OFF state.

FIG. 14B shows an example when the reflectance of the reflector 5 is low, the A/D output is lower than the A/D threshold value, and the switch operation determination unit 16 does not respond and determines the switch is in the OFF state.

FIG. 14C is an example when the reflectance of the reflector 5 is approximately intermediate, the A/D output exceeds the A/D threshold value, and the switch operation determination unit 16 responds and determines the switch is in the ON state.

FIG. 14D is an example when the reflectance of the reflector 5 is high, the A/D output exceeds the A/D threshold value, and the switch operation determination unit 16 responds and determines if the switch is in the ON state.

As is obvious from FIGS. 14A to 14D, the A/D output is largely changed according to flesh color of the fingers which are the reflector 5, color or stain of gloves, or the like. For example, in the case of the reflector 5 having low reflectance such as stained gloves, there is a concern that the switch may not respond as the infrared touch switch.

Moreover, when the switch is configured so that the user arbitrarily changes the threshold value, there is also a problem that touch detection distance of the infrared touch switch is largely different depending on the reflector.

Japanese Unexamined Patent Application, First Publication No. H9-270689 discloses a technology of a touch key which receives infrared light reflected by a reflector, detects the presence or absence of the reflector, and outputs key input signals.

According to the constitution of the infrared touch switch of the related art, a setting means according to the communication tool and a holding means to the nonvolatile memory are needed with respect to the sensitivity adjustment parameters.

Moreover, since the infrared touch switch is influenced by errors of the circuit configuring the infrared touch switch, various characteristics of the light emitting and light receiving elements, temperature characteristics, or the like, sensitivity adjustment means or sensitivity adjustment man-hours of the infrared touch switch are needed in the manufacturing process.

Moreover, since the infrared touch switch is influenced by the difference of the reflectance of the reflector, a sensitivity adjustment means or sensitivity adjustment man-hours of the infrared touch switch which are performed by the user are needed.

Furthermore, if the sensitivity adjustment parameters of the infrared touch switch are not appropriately adjusted, the operation of the infrared touch switch may be disabled.

Moreover, when the sensitivity adjustment parameters of the infrared touch switch are not appropriately set to be adjusted, there is a concern that operational feeling for each switch may be different.

SUMMARY

The present invention provides a sensitivity adjustment device in which level determination of the A/D output is relatively simply configured and can be stably executed.

A sensitivity adjustment device may include: a light receiver configured to receive a reflected light that has been emitted from a light emitting unit and reflected by a reflector, the light receiver being configured to convert the reflected light into an analog electrical signal; an A/D converter configured to convert the analog electrical signal into a digital signal; a threshold value calculator configured to calculate a threshold value with reference to a voltage level of the digital signal that has been sequentially converted and output by the A/D converter; and a determination unit configured to compare a high voltage level of the digital signal with the threshold value.

The threshold value calculator may be configured to calculate the threshold value by using at least one of a maximum value and a minimum value of the voltage level of the digital signal that has been converted and output by the A/D converter when the light emitting unit is emitting a light, and the digital signal that has been converted and output by the A/D converter when the light emitting unit is not emitting the light.

The threshold value calculator may be configured to calculate the threshold value by using a statistic of at least one of a maximum value and a minimum value of the voltage level of the digital signal that has been converted and output by the A/D converter when the light emitting unit is emitting a light, and the digital signal that has been converted and output by the A/D converter when the light emitting unit is not emitting the light.

The sensitivity adjustment device may be incorporated in an infrared touch switch. The threshold value calculator may be configured to calculate the threshold value as a sensitivity adjustment parameter to adjust touch detection sensitivity in the infrared touch switch.

The infrared touch switch may be incorporated in a field device as a switch mechanism that is manually operated.

The sensitivity adjustment device may further include: a RAM configured to store the digital signal, which has been converted and output by the A/D converter, a base value, a minimum value, and a maximum value of the voltage level of the digital signal. The threshold value calculator may be configured to calculate the threshold value based on the base value, the minimum value, and the maximum value, which have been stored in the RAM, and to output a calculated result to the determination unit.

The determination unit may be configured to compare the threshold value, which has been calculated and output by the threshold value calculator, with respect to a value of the voltage level of the digital signal, which has been sequentially converted and output by the A/D converter, corresponding to the analog signal, which has been converted by the light receiver, so as to determine presence or absence of a touch detection operation.

The RAM may be configured to update and store: an A/D reference value that is a value or an average value of the voltage level of the digital signal that has been output by the A/D converter when the light emitting unit is not emitting a light; an A/D minimum value that is a past minimum value of the voltage level of the digital signal that has been output by the A/D converter when the light emitting unit is emitting the light; and an A/D maximum value that is a past maximum value of the voltage level of the digital signal that has been output by the A/D converter when the light emitting unit is emitting the light, based on the digital signal, which has been converted and output by the A/D converter, the base value, the minimum value, and the maximum value of the voltage level of the digital signal.

The threshold value calculator may have two kinds of threshold values including a first threshold value when a switch is off and a second threshold value when the switch is on for each switch. The threshold value calculator may be configured to calculate the first threshold value by using a first threshold value calculation equation when the switch is off, the first threshold value calculation equation being: the first threshold value=A/D minimum value+(A/D minimum value−A/D reference value)×K1 (K1: constant). The threshold value calculator may be configured to calculate the second threshold value by using a second threshold value calculation equation when the switch is on, the second threshold value calculation equation being: the second threshold value=A/D minimum value+(A/D maximum value−A/D minimum value)×K2 (K2: constant). The constants K1 and K2 may correspond to a margin that alleviates design and assembly conditions by adding variation of characteristics of the switch.

The determination unit may be configured to determine "Switch OFF" if the signal level of the digital signal, which has been output from the A/D converter, is less than the threshold value. The determination unit may be configured to determine "Switch ON" if the signal level of the digital signal, which has been output from the A/D converter, is equal to or more than the threshold value.

A sensitivity adjustment method may include: receiving a reflected light that has been emitted from a light emitting unit and reflected by a reflector; converting the reflected light that has been received into an analog electrical signal; converting the analog electrical signal into a digital signal; calculating the threshold value with reference to a voltage level of the digital signal that has been sequentially converted; and comparing a high voltage level of the digital signal with the threshold value.

The sensitivity adjustment method may further include: calculating the threshold value by using at least one of a maximum value and a minimum value of the voltage level of the digital signal that has been converted when the light emitting unit is emitting a light, and the digital signal that has been converted when the light emitting unit is not emitting the light.

The sensitivity adjustment method may further include: calculating the threshold value by using a statistic of at least one of a maximum value and a minimum value of the voltage level of the digital signal that has been converted when the light emitting unit is emitting a light, and the digital signal that has been converted when the light emitting unit is not emitting the light.

The sensitivity adjustment method may further include: calculating the threshold value as a sensitivity adjustment parameter to adjust touch detection sensitivity in an infrared touch switch.

The infrared touch switch may be incorporated in a field device as a switch mechanism that is manually operated.

The sensitivity adjustment method may further include: storing the digital signal, which has been converted, a base value, a minimum value, and a maximum value of the voltage level of the digital signal; and calculating the threshold value based on the base value, the minimum value, and the maximum value that have been stored.

The sensitivity adjustment method may further include: comparing the threshold value, which has been calculated, with respect to a value of the voltage level of the digital signal, which has been sequentially converted, corresponding to the analog signal, which has been converted, so as to determine presence or absence of a touch detection operation.

The sensitivity adjustment method may further include: updating and storing: an A/D reference value that is a value or an average value of the voltage level of the digital signal, which has been converted, when the light emitting unit is not emitting a light; an A/D minimum value that is a past minimum value of the voltage level of the digital signal, which has been converted, when the light emitting unit is emitting the light; and an A/D maximum value that is a past maximum value of the voltage level of the digital signal, which has been converted, when the light emitting unit is emitting the light, based on the digital signal, which has been converted, the base value, the minimum value, and the maximum value of the voltage level of the digital signal.

The sensitivity adjustment method may further include: calculating a first threshold value by using a first threshold value calculation equation when a switch is off, the first threshold value calculation equation being: the first threshold value=A/D minimum value+(A/D minimum value−A/D reference value)×K1 (K1: constant); and calculating a second threshold value by using a second threshold value calculation equation when the switch is on, the second threshold value calculation equation being: the second threshold value=A/D minimum value+(A/D maximum value−A/D minimum value)×K2 (K2: constant). The constants K1 and K2 may correspond to a margin that alleviates design and assembly conditions by adding variation of characteristics of the switch.

The sensitivity adjustment method may further include: determining "Switch OFF" if the signal level of the digital signal is less than the threshold value; and determining "Switch ON" if the signal level of the digital signal is equal to or more than the threshold value.

BRIEF DESCRIPTION OF THE DRAWINGS

The above features and advantages of the present invention will be more apparent from the following description of certain preferred embodiments taken in conjunction with the accompanying drawings, in which:

FIGS. 4A to 4I are illustrative diagrams illustrating a determination sequence in the switch operation determination unit in FIG. 1;

FIGS. 12(a) to 12(e) are illustrative diagrams illustrating a determination sequence in the switch operation determination unit in FIG. 9;

DETAILED DESCRIPTION OF THE PREFERRED EMBODIMENTS

The present invention will be now described herein with reference to illustrative preferred embodiments. Those skilled in the art will recognize that many alternative preferred embodiments can be accomplished using the teaching of the present invention and that the present invention is not limited to the preferred embodiments illustrated herein for explanatory purposes.

Figure 1:
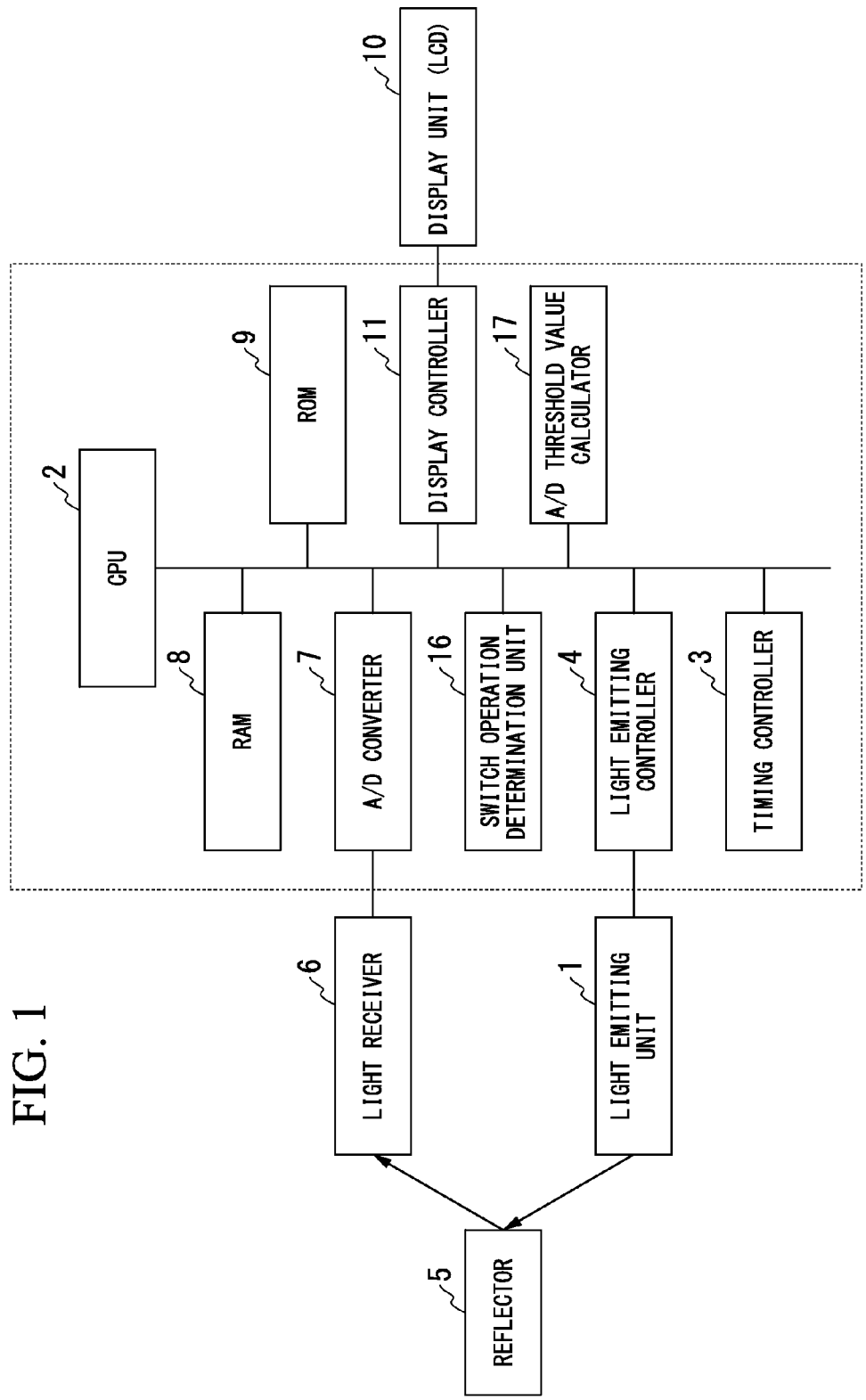
FIG. 1 is a block diagram illustrating an example of a first preferred embodiment of the present invention.
Figure 9:
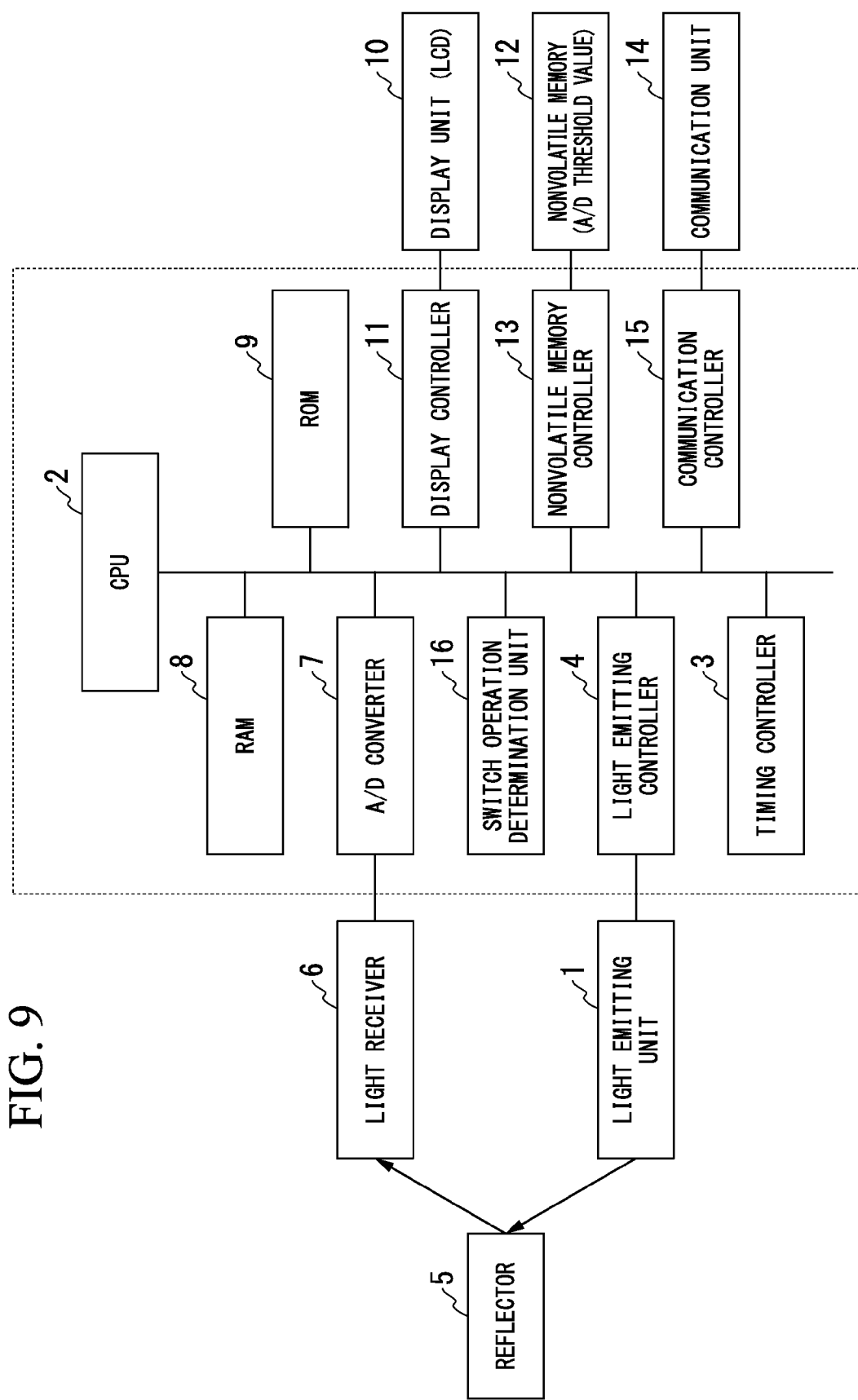
FIG. 9 is a block diagram illustrating an example of the field device in which the infrared touch switch of the related art is incorporated.

A first preferred embodiment of the present invention will be described with reference to the drawings. FIG. 1 is a block diagram illustrating an example of a first preferred embodiment of the present invention. In FIG. 1, the same reference numerals are assigned to the portions in common with those of FIG. 9. The difference between FIG. 1 and FIG. 9 is in that an A/D threshold value calculator 17 is provided, and the nonvolatile memory 12, the nonvolatile memory controller 13, the communication unit 14, and the communication controller 15 of FIG. 9 are not needed in FIG. 1.

The A/D threshold value calculator 17 calculates an A/D threshold value based on a base value, a minimum value, and a maximum value which are converted and output by the A/D converter 7, for example, are stored in the RAM 8, and outputs the calculated results to the switch operation determination unit 16.

The switch operation determination unit 16 compares the threshold value calculated and output by the A/D threshold value calculator 17 with respect to values of digital signals corresponding to analog signals which are sequentially converted and output by the A/D converter 7 and are converted by the light receiver 6, and determines the presence or absence of a touch detection operation.

Figure 2:
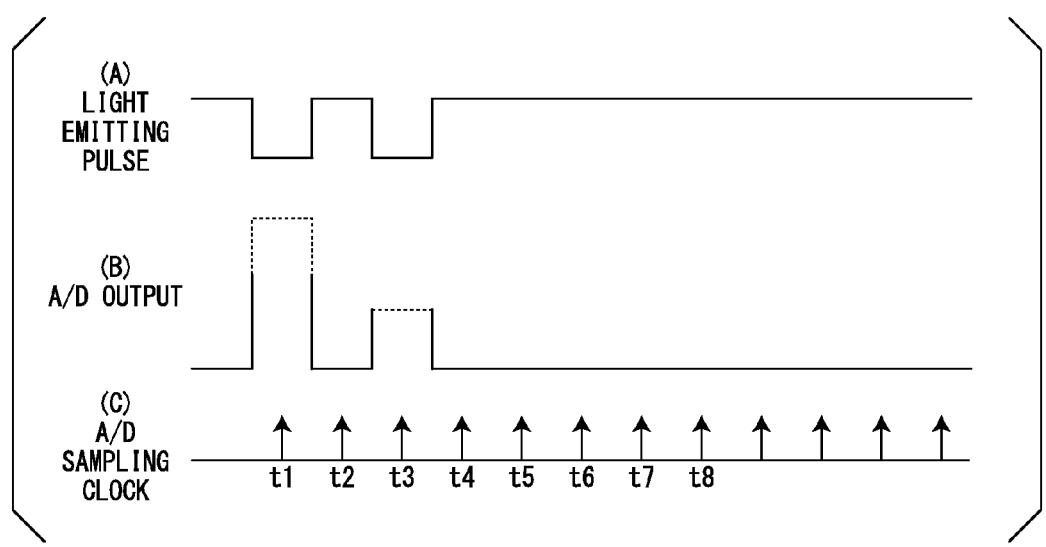
FIGS. 2(A) to 2(C) are timing charts illustrating specific examples of light emitting unit driving signals generated by a light emitting controller in FIG. 1, light receiving signals input to an A/D converter, and sampling timing of the A/D converter.
Figure 10:
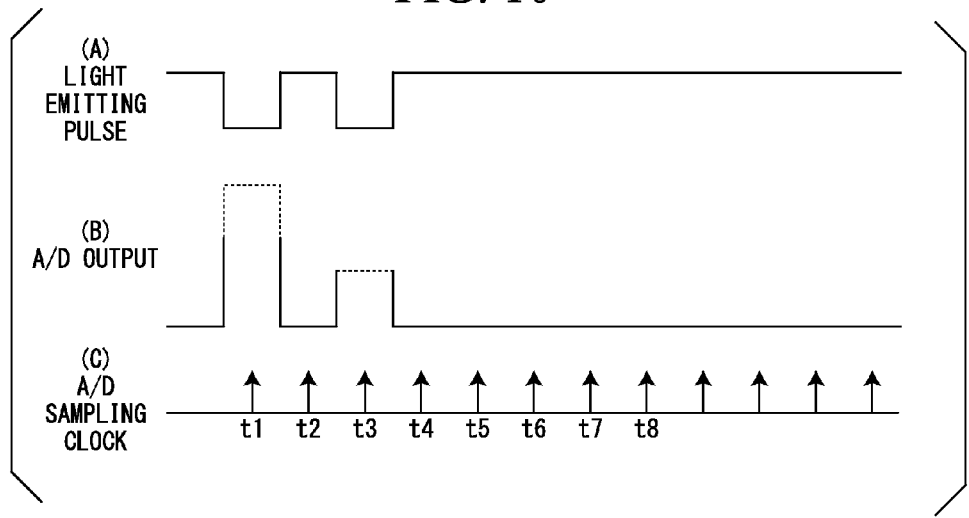
FIGS. 10(A) to 10(C) are timing charts illustrating specific examples of light emitting unit driving signals generated by a light emitting controller in FIG. 9, light receiving signals input to an A/D converter, and sampling timings of the A/D converter.
Figure 11A:
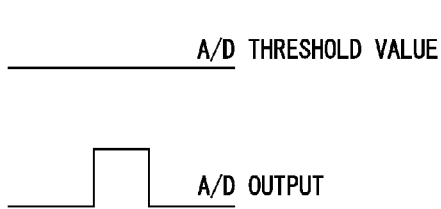
FIGS. 11A and 11B are diagrams illustrating a relationship between a signal level and a threshold value in the switch operation determination unit in FIG. 9.
Figure 11B:
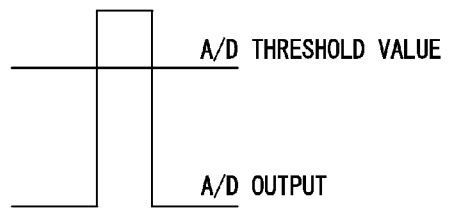
Figure 13A:
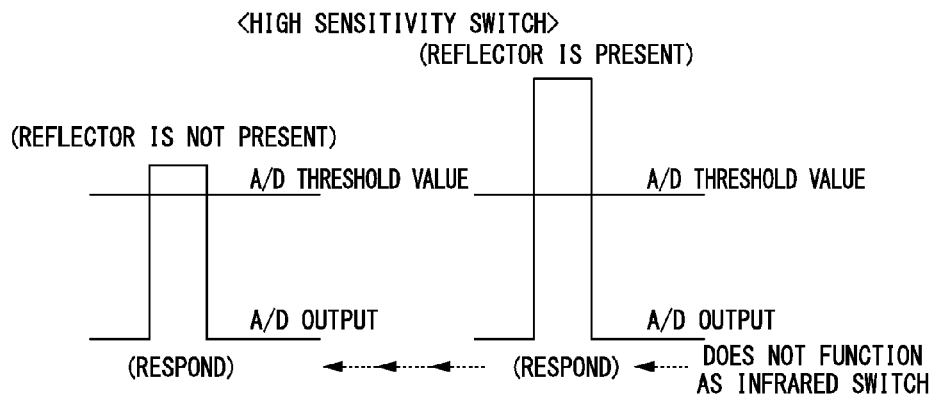
FIGS. 13A to 13C are illustrative diagrams of sensitivity when there are differences in hardware characteristics in a constitution of FIG. 9.
Figure 13B:
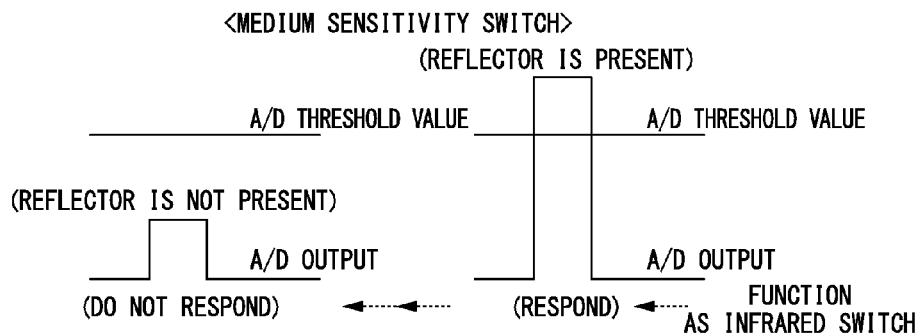
Figure 13C:
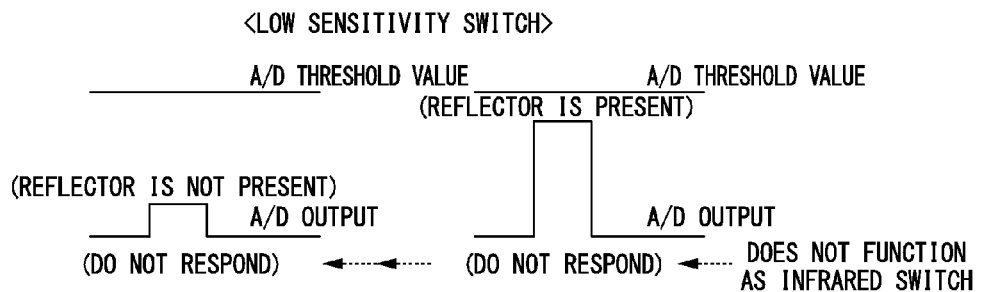
Figure 14A:
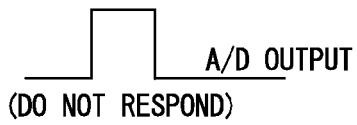
FIGS. 14A to 14D are illustrative diagrams of sensitivity when there are differences in reflection characteristics of a reflector in a constitution of FIG. 9.
Figure 14B:
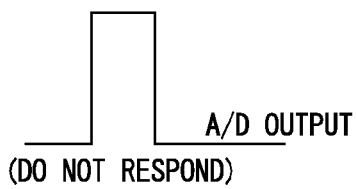
Figure 14C:
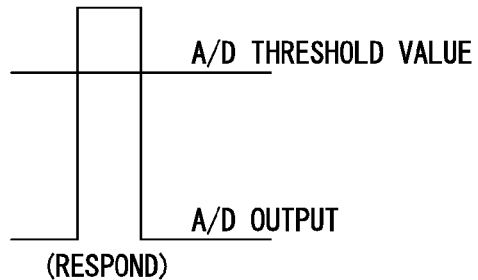
Figure 14D:
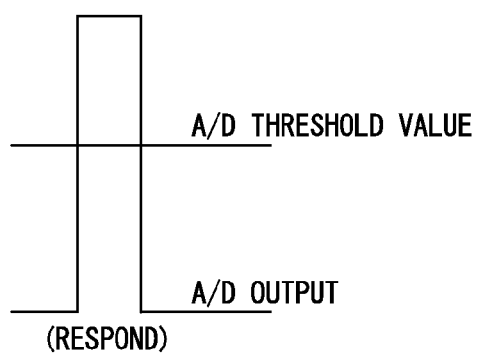

FIGS. 2(A) to 2(C) are illustrative diagrams of data sampling of the analog electric signals converted by the light receiver 6 in the A/D converter 7. FIGS. 2(A) to 2(C) are similar to FIGS. 10(A) to 10(C). FIG. 2(A) is the light emission pulse which is radiated from the light emitting unit 1, and the pulse is emitted and output based on a predetermined timing pulse signal which is generated and output by the timing controller 3 controlled by the CPU 2.

FIG. 2(B) is output data of the A/D converter 7 based on reflected light incident to the light receiver 6, and the A/D conversion operation of the A/D converter 7 is executed based on a predetermined sampling clock which is indicated by FIG. 2(C) and generated and output by the timing controller 3.

Here, similar to the related art, the intensity of the reflected light is changed according to presence or absence of the reflector 5 or a difference of reflectance of the reflector 5, and a signal level of the output data of the A/D converter 7 is changed according to the change of the intensity. The frequency of the light emission pulse or timing of light-receiving A/D sampling may be arbitrarily determined.

The following data (1) to (3) that are needed to calculate the A/D threshold value by the A/D threshold value calculator 17 is updated based on an output data group of the A/D converter 7.

(1) A/D reference value: output data or average value of A/D converter 7 when light is not emitted (timings t5 to t8 of FIGS. 2(A) to 2(C))

(2) A/D minimum value: past minimum value of output data of A/D converter 7 when light is emitted (timings t1 and t3 of FIGS. 2(A) to 2(C))

(3) A/D maximum value: past maximum value of output data of A/D converter 7 when light is emitted (timings t1 and t3 of FIGS. 2(A) to 2(C))

For example, the data is held and stored not in the nonvolatile memory but in the RAM 8.

The A/D threshold value calculator 17 includes two kinds of the A/D threshold value when the switch is off and the A/D threshold value when the switch is on for each switch. The A/D threshold value calculator 17 switches the threshold value calculation equation to (1) a threshold value calculation equation when the switch is off and (2) a threshold value calculation equation when the switch is on as described below depending on the state of the switch.

(1) Threshold value calculation equation when switch is off:

A/D threshold value=A/D minimum value+(A/D minimum value−A/D reference value)×$K1$ ($K1$: constant)

(2) Threshold value calculation equation when switch is on:

$$\text{A/D threshold value} = \text{A/D minimum value} + (\text{A/D maximum value} - \text{A/D minimum value}) \times K2 \quad (K2: \text{constant})$$

Here, constants K1 and K2 correspond to a margin which alleviates design and assembly conditions by adding variation of characteristics of the configured switch.

Figure 3A:
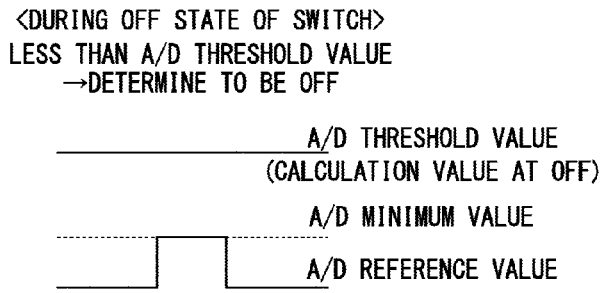
FIGS. 3A to 3D are diagrams illustrating a relationship between a signal level and a threshold value in the switch operation determination unit in FIG. 1.
Figure 3B:
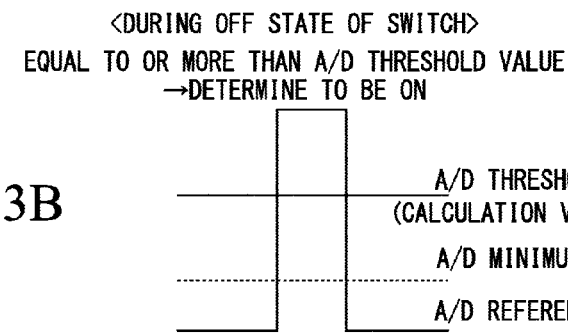
Figure 3C:
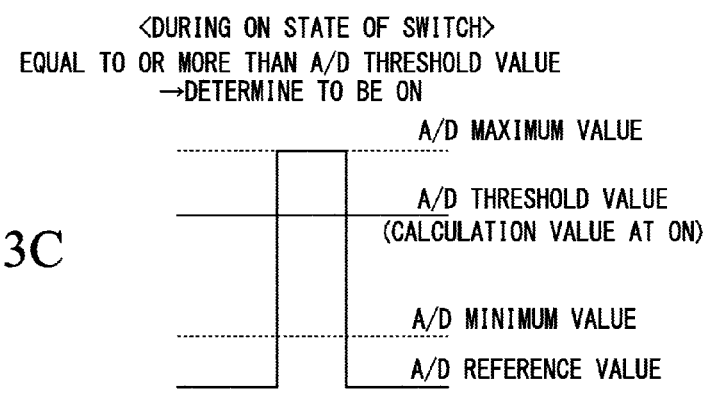
Figure 3D:
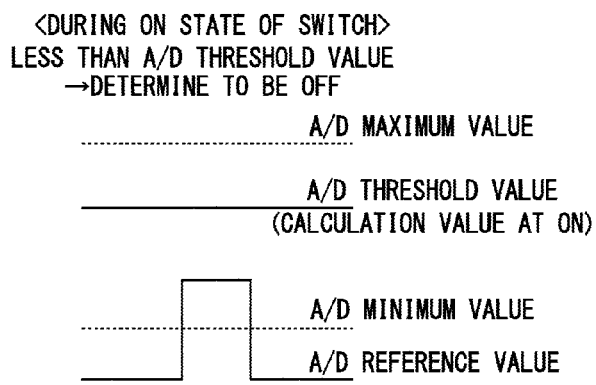

FIGS. 3A to 3D are illustrative diagrams of an operation of the switch operation determination unit 16 based on the A/D threshold value. When the output data of the A/D converter 7 is less than the A/D threshold value, as shown in FIGS. 3A and 3D, the switch operation determination unit 16 determines "Switch OFF." When the output data of the A/D converter 7 is equal to or more than the A/D threshold value, as shown in FIGS. 3B and 3C, the switch operation determination unit 16 determines "Switch ON."

FIGS. 3A and 3B show determination operations during the OFF state of the switch.

FIGS. 3C and 3D show determination operations during the ON state of the switch.

Since the hardware characteristics of each infrared touch switch are different, the A/D threshold value is needed for each switch.

Moreover, the A/D threshold value is updated by automatic calculation if necessary, and thus, unlike the related art shown in FIG. 9, holding the A/D threshold value in the nonvolatile memory is not needed.

FIGS. 4A to 4I are illustrative diagrams of a determination sequence in the switch operation determination unit 16.

FIG. 4A shows an "initial state." The switch is in the OFF state, and current A/D output data is set to the above-described "A/D minimum value." The A/D output data is less than the A/D threshold value when the switch is off.

FIG. 4B shows that "there is no state transition." FIG. 4B shows a state in which the A/D output data is increased from the state of FIG. 4A to a range in which the A/D output data does not exceed the A/D threshold value. The A/D minimum value is not updated, and the A/D threshold value is not changed either. Since the A/D output data is less than the A/D threshold value, the switch remains in the OFF state.

FIG. 4C shows "update of the A/D minimum value." FIG. 4C shows a state in which the A/D output data is decreased from the state of FIG. 4B to a range in which the A/D output data is lower than the A/D minimum value. The A/D minimum value is updated, and the A/D threshold value is also changed. Since the A/D output data is less than the A/D threshold value, the switch remains in the OFF state.

FIG. 4D shows "detection of switch ON." FIG. 4D is a state in which the A/D output is increased from the state of FIG. 4C to a range in which the A/D output data exceeds the A/D threshold value. The A/D minimum value is not updated, and the A/D threshold value is not changed either. Since the A/D output data is equal to or more than the A/D threshold value when the switch is off, the switch is changed to the ON state.

FIG. 4E shows "switching of the A/D threshold value." The switch is in the ON state, and current A/D output data is set to the above-described "A/D maximum value." The A/D output data is equal to or more than the A/D threshold value when the switch is on.

FIG. 4F shows "update of the A/D maximum value." FIG. 4F is a state in which the A/D output is increased from the state of FIG. 4E to a range in which the A/D output data exceeds the A/D maximum value. The A/D maximum value is updated, and the A/D threshold value is also changed. Since the A/D output data is equal to or more than the A/D threshold value when the switch is on, the switch remains in the ON state.

FIG. 4G shows that "there is no state transition." FIG. 4G shows a state in which the A/D output data is decreased from the state of FIG. 4F to a range in which the A/D output data is not lower than the A/D threshold value. The A/D maximum value is not updated, and the A/D threshold value is not changed either. Since the A/D output data is equal to or more than the A/D threshold value when the switch is on, the switch remains in the ON state.

FIG. 4H shows "detection of switch OFF." FIG. 4D is a state in which the A/D output is decreased from the state of FIG. 4G to a range in which the A/D output data is lower than the A/D threshold value. The A/D maximum value is not updated, and the A/D threshold value is not changed either. Since the A/D output data is less than the A/D threshold value when the switch is on, the switch is changed to the OFF state.

FIG. 4I shows "switching (reset) of the A/D threshold value." The switch is in the OFF state, and current A/D output data is reset as the "A/D minimum value." The A/D output data is less than the A/D threshold value when the switch is off.

Figure 5A:
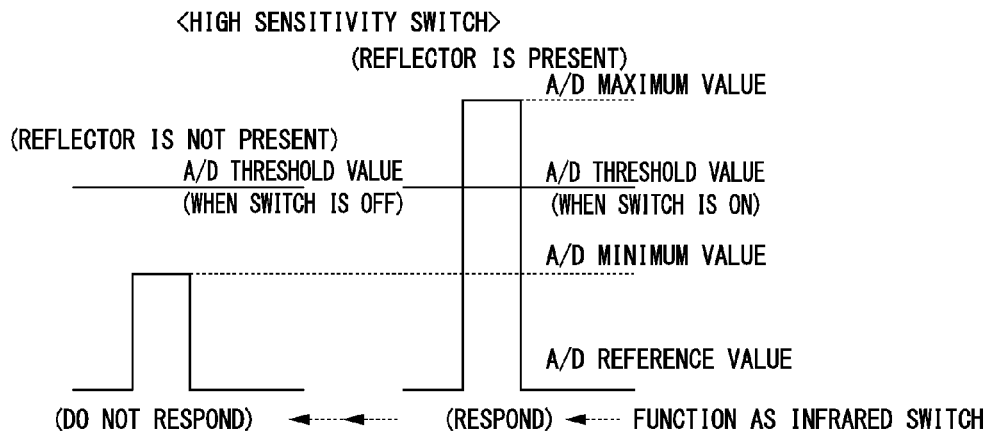
FIGS. 5A to 5C are illustrative diagrams of sensitivity when there are differences in hardware characteristics in a constitution of FIG. 1.
Figure 5B:
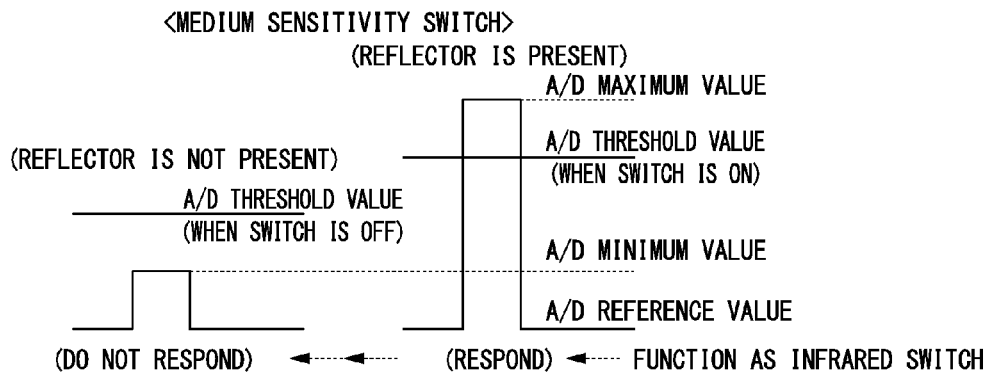
Figure 5C:
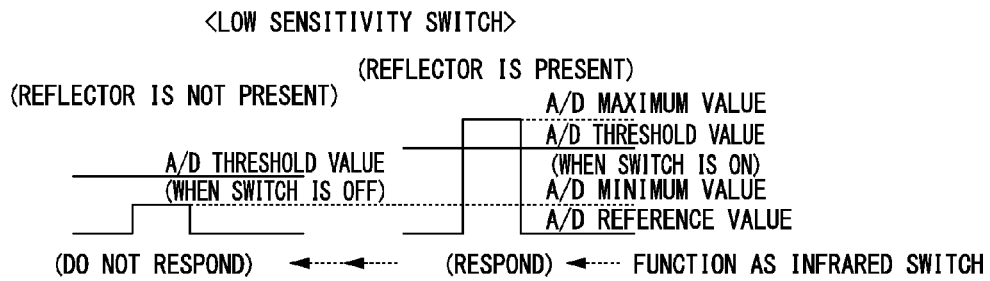

FIGS. 5A to 5C are illustrative diagrams of an operation of the A/D output data when there are differences in hardware characteristics in the infrared touch switch. FIG. 5A shows an example of a high sensitivity switch. FIG. 5B shows an example of a medium sensitivity switch. FIG. 5C shows an example of a low sensitivity switch.

Focusing on a relationship between the A/D output data and the A/D threshold value, in all cases of FIGS. 5A to 5C, the following relationship is maintained without depending on the differences of the hardware characteristics of the infrared touch switch according to the algorithm shown in FIGS. 4A to 4I, and thus the switch functions as the infrared touch switch.

Figure 6A:
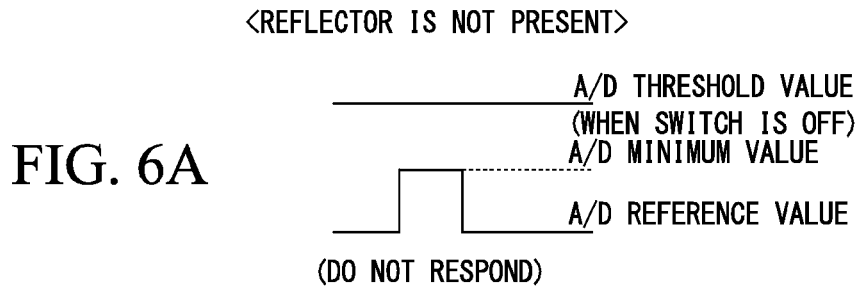
FIGS. 6A to 6D are illustrative diagrams of sensitivity when there are differences in reflection characteristics of a reflector in a constitution of FIG. 1.
Figure 6B:
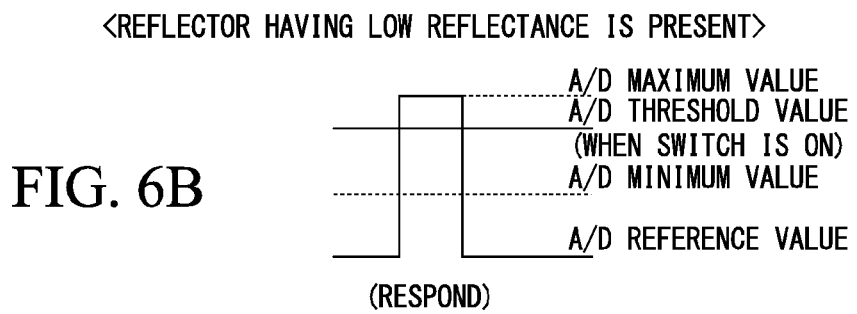
Figure 6C:
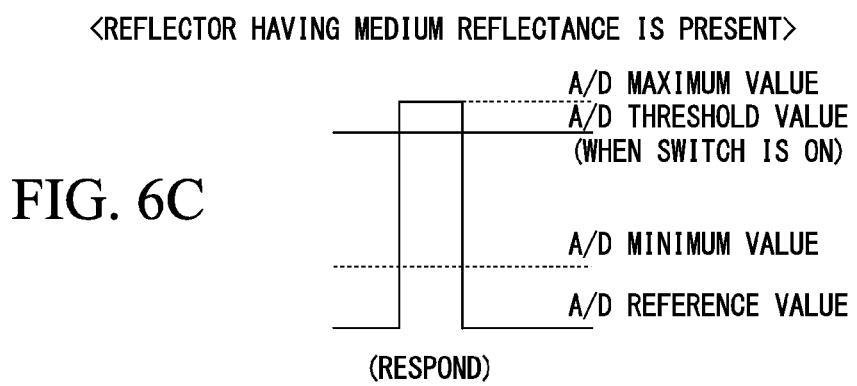
Figure 6D:
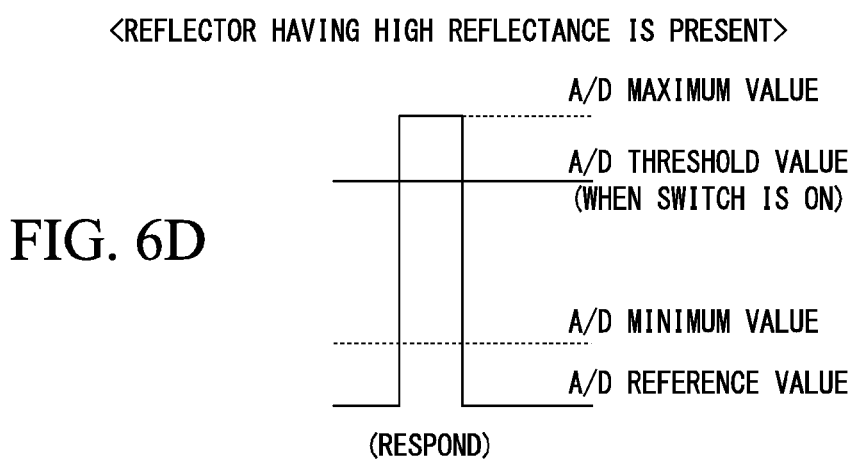

(1) When the reflector is not present: A/D output data<A/D threshold value (2) When the reflector is present: A/D output data>A/D threshold value FIGS. 6A to 6D are illustrative diagrams of an operation of the A/D output data when there are differences of characteristics of the reflector 5. FIG. 6A shows an example in which the reflector is not present. FIG. 6B shows an example of a reflector having low reflectance. FIG. 6C shows an example of a reflector having medium reflectance. FIG. 6D shows an example of a reflector having high reflectance.

Focusing on the relationship between the A/D output data and the A/D threshold value, in all cases of FIGS. 6A to 6D, the following relationship is maintained without depending on presence or absence of the reflector according to the algorithm shown in FIGS. 4A to 4I, and thus the switch functions as the infrared touch switch.

(1) When the reflector is not present: A/D output data<A/D threshold value (2) When the reflector is present: A/D output data>A/D threshold value According to this constitution, with respect to the A/D threshold value which is the sensitivity adjustment parameter of the infrared touch switch, unlike the related art, setting means according to the communication tool and holding means to the nonvolatile memory are not needed. Accordingly, the number of components in the circuit can be decreased, setting and input of the threshold value, program design of communication protocol, or the like is not needed, and the cost is reduced.

Since the infrared touch switch is not influenced by hardware characteristics such as circuit errors, characteristics of the light emitting and light receiving elements, and temperature characteristics in the infrared touch switch, sensitivity adjustment means or sensitivity adjustment man-hours of the infrared touch switch are not needed in the manufacturing process.

Since influences due to the difference of the reflector such as the flesh color of the user, the color of the gloves, or stain are eliminated, the sensitivity adjustment means and the sensitivity adjustment procedure of the infrared touch switch which are performed by the user are needed.

An inoperable state of the infrared touch switch does not occur.

That is, the infrared touch switch is configured using the sensitivity adjustment device according to the present invention, and thus the operational feeling of the switch which is always stable can be obtained without receiving influences such as the hardware characteristics for each switch or the difference of the reflector.

Figure 7:
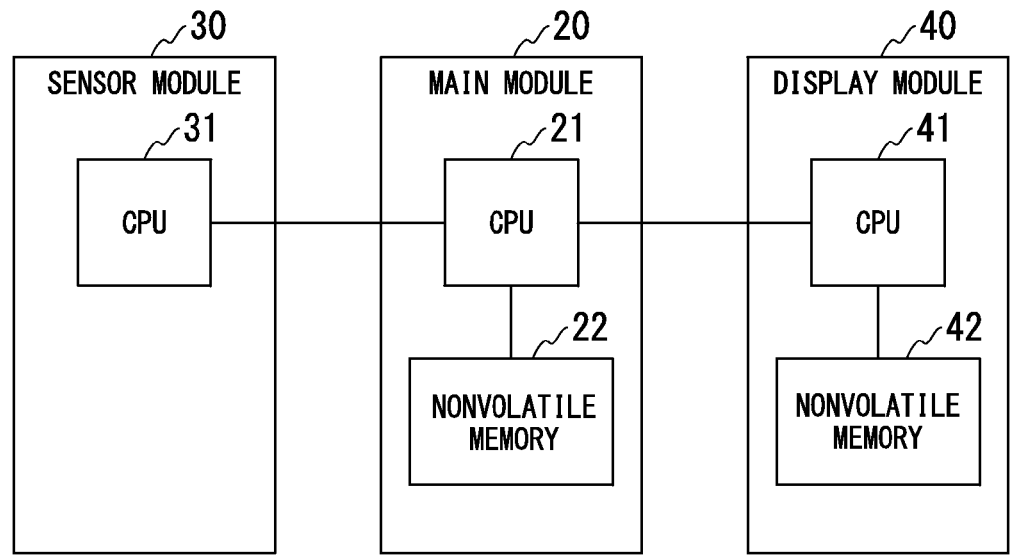
FIG. 7 is a schematic block diagram illustrating an example of a field device on which an infrared touch switch of the related art is mounted.

FIG. 7 is a schematic block diagram illustrating an example of field device on which the infrared touch switch of the related art is mounted. In FIG. 7, as a common platform design considering the change of a module, the field device (for example, a flow meter) is configured of three modules including a main module 20, a sensor module 30, and a display module 40.

The main module 20 includes a dedicated CPU 21 and a nonvolatile memory 22 which is connected to the CPU 21. The sensor module 30 includes a dedicated CPU 31. The display module 40 includes a dedicated CPU 41 and a nonvolatile memory 42 to store the A/D threshold value of the infrared touch switch connected to the CPU 41.

The CPU 31 of the sensor module 30 and the CPU 41 of the display module 40 are connected to the CPU 21 of the main module 20.

Here, the nonvolatile memory 22 of the main module 20 and the nonvolatile memory 42 of the display module 40 are provided individually because the set information related to the independent function of each module needs to be held in each nonvolatile memory of the corresponding module in preparation for a case where the module is changed.

Accordingly, even when the set information is little, the nonvolatile memory having excessive capacity should be mounted, and thus the cost is increased.

Figure 8:
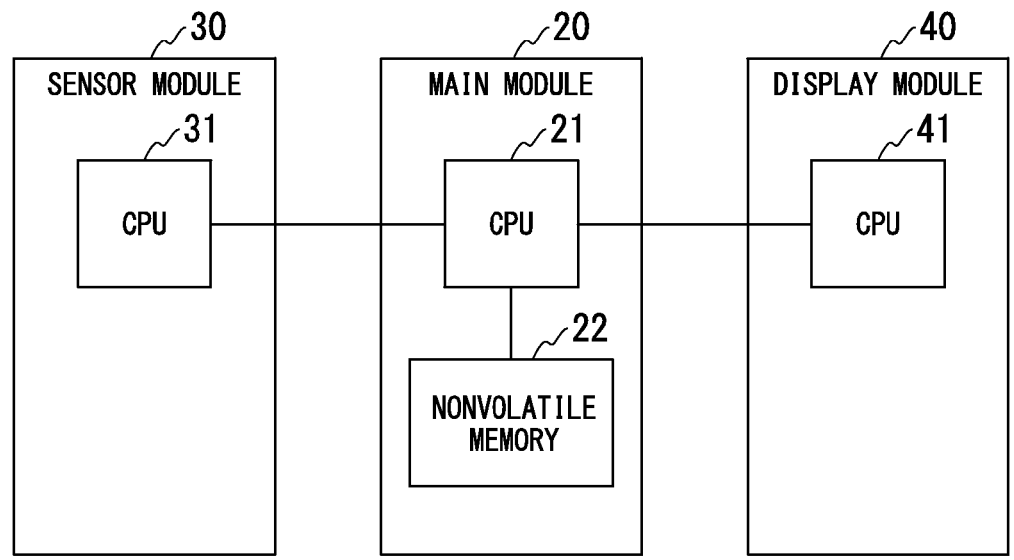
FIG. 8 is a schematic block diagram of a field device on which an infrared touch switch configured to use a sensitivity adjustment device according to the present invention is mounted.

In the other hand, FIG. 8 is a schematic block diagram of the field device on which an infrared touch switch configured to use the sensitivity adjustment device according to the present invention is mounted, and the same reference numerals are attached to the portions in common with those of FIG. 7. In FIG. 8, only the CPU 41 is provided in the display module 40, and thus, unlike FIG. 7, the nonvolatile memory 42 is not provided.

This is because the sensitivity adjustment device according to the present invention is configured so that the A/D threshold value of the infrared touch switch is automatically calculated based on the digital signals converted and calculated from the A/D converter, and thus it is not necessary to store the A/D threshold value.

As a result, the nonvolatile memory 42 is not needed, the cost of the component can be reduced, and the cost of interface software used to transfer the data by connecting the nonvolatile memory 42 to the CPU 41 can also be reduced.

Moreover, the frequency or the pattern of the light emission pulse of the A/D obtaining timing in the embodiment may be arbitrarily changed.

The timing or the frequency of the light-receiving A/D sampling when the light is emitted and when the light is not emitted may be arbitrarily changed.

The A/D reference value may be an average value of the plurality of data.

The past range in which the A/D minimum value and the A/D maximum value are obtained may be appropriately changed.

Moreover, the constants K1 and K2 in the calculation equations of the A/D threshold value may be variables according to other parameters.

As described above, according to the present invention, the sensitivity adjustment device in which level determination of the A/D output is relatively simply configured and can be stably executed can be provided, and for example, the sensitivity adjustment device is suitable as the sensitivity adjustment means of the infrared touch switch mounted on the display module of the field device.

As used herein, the following directional terms "forward, rearward, above, downward, right, left, vertical, horizontal, below, transverse, row and column" as well as any other similar directional terms refer to those directions of an apparatus equipped with the present invention. Accordingly, these terms, as utilized to describe the present invention should be interpreted relative to an apparatus equipped with the present invention.

The term "configured" is used to describe a component, unit or part of a device includes hardware and software that is constructed and/or programmed to carry out the desired function.

Moreover, terms that are expressed as "means-plus-function" in the claims should include any structure that can be utilized to carry out the function of that part of the present invention.

The term "unit" is used to describe a component, unit or part of a hardware and software that is constructed and/or programmed to carry out the desired function. Typical examples of the hardware may include, but are not limited to, a device and a circuit.

While preferred embodiments of the present invention have been described and illustrated above, it should be understood that these are examples of the present invention and are not to be considered as limiting. Additions, omissions, substitutions, and other modifications can be made without departing from the scope of the present invention. Accordingly, the present invention is not to be considered as being limited by the foregoing description, and is only limited by the scope of the claims.

What is claimed is:

1. A sensitivity adjustment device comprising:
   a light receiver configured to receive a reflected light that has been emitted from a light emitting unit and reflected by a reflector, the light receiver being configured to convert the reflected light into an analog electrical signal;
   an A/D converter configured to convert the analog electrical signal into a digital signal;
   a threshold value calculator configured to calculate a threshold value with reference to a voltage level of the digital signal that has been sequentially converted and output by the A/D converter; and
   a determination unit configured to compare a high voltage level of the digital signal with the threshold value,
   wherein the threshold value calculator is configured to calculate the threshold value by using at least one of a maximum value and a minimum value of the voltage level of the digital signal that has been converted and output by the A/D converter when the light emitting unit is emitting a light, and the digital signal that has been converted and output by the A/D converter when the light emitting unit is not emitting the light.

2. The sensitivity adjustment device according to claim 1, wherein
the threshold value calculator is configured to calculate the threshold value by using a statistic of at least one of a maximum value and a minimum value of the voltage level of the digital signal that has been converted and output by the A/D converter when the light emitting unit is emitting a light, and the digital signal that has been converted and output by the A/D converter when the light emitting unit is not emitting the light.

3. The sensitivity adjustment device according to claim 1, wherein
the sensitivity adjustment device is incorporated in an infrared touch switch, and
the threshold value calculator is configured to calculate the threshold value as a sensitivity adjustment parameter to adjust touch detection sensitivity in the infrared touch switch.

4. The sensitivity adjustment device according to claim 3, wherein the infrared touch switch is incorporated in a field device as a switch mechanism that is manually operated.

5. The sensitivity adjustment device according to claim 1, wherein
the determination unit is configured to compare the threshold value, which has been calculated and output by the threshold value calculator, with respect to a value of the voltage level of the digital signal, which has been sequentially converted and output by the A/D converter, corresponding to the analog signal, which has been converted by the light receiver, so as to determine presence or absence of a touch detection operation.

6. The sensitivity adjustment device according to claim 1, wherein
the determination unit is configured to determine "Switch OFF" if the signal level of the digital signal, which has been output from the A/D converter, is less than the threshold value, and
the determination unit is configured to determine "Switch ON" if the signal level of the digital signal, which has been output from the A/D converter, is equal to or more than the threshold value.

7. A sensitivity adjustment device comprising:
a light receiver configured to receive a reflected light that has been emitted from a light emitting unit and reflected by a reflector, the light receiver being configured to convert the reflected light into an analog electrical signal;
an A/D converter configured to convert the analog electrical signal into a digital signal;
a threshold value calculator configured to calculate a threshold value with reference to a voltage level of the digital signal that has been sequentially converted and output by the A/D converter;
a determination unit configured to compare a high voltage level of the digital signal with the threshold value; and
a RAM configured to store the digital signal, which has been converted and output by the A/D converter, a reference value, a minimum value, and a maximum value of the voltage level of the digital signal,
wherein
the threshold value calculator is configured to calculate the threshold value based on the reference value, the minimum value, and the maximum value, which have been stored in the RAM, and to output a calculated result to the determination unit, and
the RAM is configured to update and store:
an A/D reference value that is a value or an average value of the voltage level of the digital signal that has been output by the A/D converter when the light emitting unit is not emitting a light;
an A/D minimum value that is a past minimum value of the voltage level of the digital signal that has been output by the A/D converter when the light emitting unit is emitting the light; and
an A/D maximum value that is a past maximum value of the voltage level of the digital signal that has been output by the A/D converter when the light emitting unit is emitting the light,
based on the digital signal, which has been converted and output by the A/D converter, the reference value, the minimum value, and the maximum value of the voltage level of the digital signal.

8. The sensitivity adjustment device according to claim 7, wherein
the threshold value calculator has two kinds of threshold values including a first threshold value when a switch is off and a second threshold value when the switch is on for each switch,
the threshold value calculator is configured to calculate the first threshold value by using a first threshold value calculation equation when the switch is off, the first threshold value calculation equation being: the first threshold value=A/D minimum value+(A/D minimum value−A/D reference value)×K1 (K1: constant),
the threshold value calculator is configured to calculate the second threshold value by using a second threshold value calculation equation when the switch is on, the second threshold value calculation equation being: the second threshold value=A/D minimum value+(A/D maximum value−A/D minimum value)×K2 (K2: constant), and
the constants K1 and K2 correspond to a margin that alleviates design and assembly conditions by adding variation of characteristics of the switch.

9. A sensitivity adjustment method comprising:
receiving a reflected light that has been emitted from a light emitting unit and reflected by a reflector;
converting the reflected light that has been received into an analog electrical signal;
converting the analog electrical signal into a digital signal;
calculating the threshold value with reference to a voltage level of the digital signal that has been sequentially converted;
comparing a high voltage level of the digital signal with the threshold value; and
calculating the threshold value by using at least one of a maximum value and a minimum value of the voltage level of the digital signal that has been converted when the light emitting unit is emitting a light, and the digital signal that has been converted when the light emitting unit is not emitting the light.

10. The sensitivity adjustment method according to claim 9, further comprising:
calculating the threshold value by using a statistic of at least one of a maximum value and a minimum value of the voltage level of the digital signal that has been converted when the light emitting unit is emitting a light, and the digital signal that has been converted when the light emitting unit is not emitting the light.

11. The sensitivity adjustment method according to claim 10, further comprising:
   calculating the threshold value as a sensitivity adjustment parameter to adjust touch detection sensitivity in an infrared touch switch.

12. The sensitivity adjustment method according to claim 11, wherein
   the infrared touch switch is incorporated in a field device as a switch mechanism that is manually operated.

13. The sensitivity adjustment method according to claim 9, further comprising:
   storing the digital signal, which has been converted, a base value, a minimum value, and a maximum value of the voltage level of the digital signal; and
   calculating the threshold value based on the base value, the minimum value, and the maximum value that have been stored.

14. The sensitivity adjustment method according to claim 9, further comprising:
   comparing the threshold value, which has been calculated, with respect to a value of the voltage level of the digital signal, which has been sequentially converted, corresponding to the analog signal, which has been converted, so as to determine presence or absence of a touch detection operation.

15. The sensitivity adjustment method according to claim 13, further comprising:
   updating and storing:
   an A/D reference value that is a value or an average value of the voltage level of the digital signal, which has been converted, when the light emitting unit is not emitting a light;
   an A/D minimum value that is a past minimum value of the voltage level of the digital signal, which has been converted, when the light emitting unit is emitting the light; and
   an A/D maximum value that is a past maximum value of the voltage level of the digital signal, which has been converted, when the light emitting unit is emitting the light,
   based on the digital signal, which has been converted, the base value, the minimum value, and the maximum value of the voltage level of the digital signal.

16. The sensitivity adjustment method according to claim 15, further comprising:
   calculating a first threshold value by using a first threshold value calculation equation when a switch is off, the first threshold value calculation equation being: the first threshold value=A/D minimum value+(A/D minimum value−A/D reference value)×K1 (K1: constant); and
   calculating a second threshold value by using a second threshold value calculation equation when the switch is on, the second threshold value calculation equation being: the second threshold value=A/D minimum value+(A/D maximum value−A/D minimum value)×K2 (K2: constant), wherein
   the constants K1 and K2 correspond to a margin that alleviates design and assembly conditions by adding variation of characteristics of the switch.

17. The sensitivity adjustment method according to claim 9, further comprising:
   determining "Switch OFF" if the signal level of the digital signal is less than the threshold value; and
   determining "Switch ON" if the signal level of the digital signal is equal to or more than the threshold value.

* * * * *